United States Patent
Yang

(10) Patent No.: US 8,450,219 B2
(45) Date of Patent: May 28, 2013

(54) METHOD OF FABRICATING AL2O3 THIN FILM LAYER

(75) Inventor: Tsun-Neng Yang, Taipei (TW)

(73) Assignee: Atomic Energy Council—Institute of Nuclear Research, Lungtan, Taoyuan County (TW)

( * ) Notice: Subject to any disclaimer, the term of this patent is extended or adjusted under 35 U.S.C. 154(b) by 113 days.

(21) Appl. No.: 13/248,146

(22) Filed: Sep. 29, 2011

(65) Prior Publication Data

US 2013/0084715 A1  Apr. 4, 2013

(51) Int. Cl.
*H01L 21/31* (2006.01)
*H01L 21/469* (2006.01)

(52) U.S. Cl.
USPC .... 438/778; 438/780; 438/799; 257/E21.077; 257/E21.082

(58) Field of Classification Search
USPC .................. 438/778, 780, 799; 257/E21.077, 257/E21.082
See application file for complete search history.

(56) References Cited

U.S. PATENT DOCUMENTS

| | | | |
|---|---|---|---|
| 8,043,992 B2 * | 10/2011 | Hatanaka et al. | 502/327 |
| 8,318,267 B2 * | 11/2012 | Kabe et al. | 427/575 |
| 2003/0001134 A1 * | 1/2003 | Sekiya et al. | 252/79.1 |
| 2004/0025753 A1 * | 2/2004 | Brunner et al. | 106/739 |

* cited by examiner

*Primary Examiner* — Phuc Dang
(74) *Attorney, Agent, or Firm* — Jackson IPG PLLC

(57) ABSTRACT

An $Al_2O_3$ thin film layer is fabricated. Atmospheric pressure chemical vapor deposition (APCVD) is processed in a normal atmospheric pressure and a low temperature. On a surface of a p-type or n-type silicon crystal wafer having a purity between 5N (99.999%) and 9N (99.9999999%), the $Al_2O_3$ thin film layer is deposited and fabricated. The deposition and fabrication are done to obtain chemical passivation and field effect passivation. In this way, the present invention can be applied in solar cells and other photoelectric devices with reduced leakage of surface currents and improved photoelectric conversion.

Figure 1:
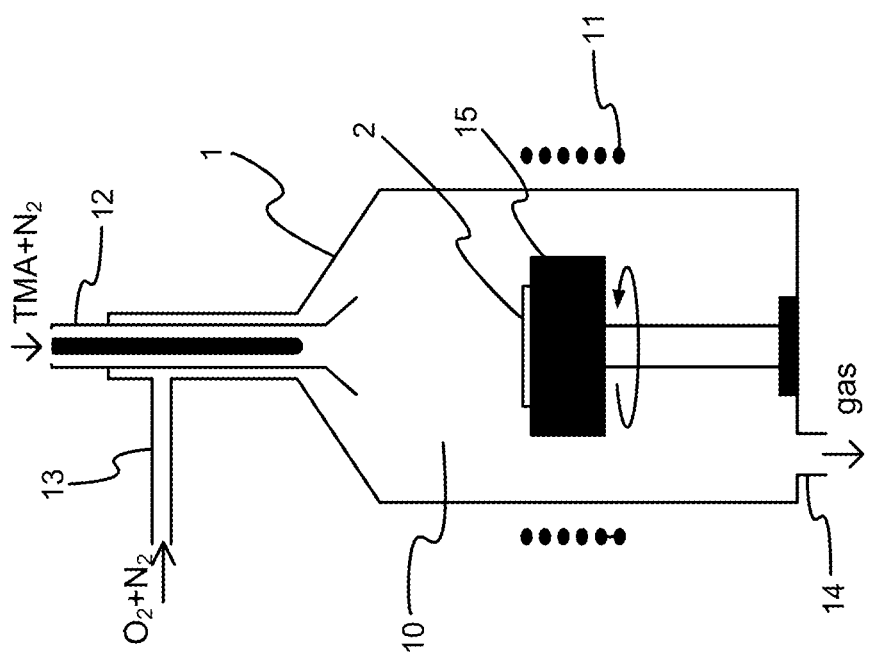

11 Claims, 2 Drawing Sheets

METHOD OF FABRICATING AL2O3 THIN FILM LAYER

TECHNICAL FIELD OF THE INVENTION

The present invention relates to $Al_2O_3$ thin film; more particularly, relates to fabricating an $Al_2O_3$ thin film layer through a simple, fast and single procedure in an environment having a normal atmospheric pressure and a low temperature to obtain both effects of chemical passivation and field effect passivation.

DESCRIPTION OF THE RELATED ARTS

Following the increase in population, the development in civilization and the demands for a better life, power needs are increasing day by day. Fossil fuel is thus greatly consumed and its price is getting higher and higher while its storage on earth is rapidly running short. At the same time, a great pollution is thus formed to danger human's life owing to the global warming and abnormal weather.

Alternative energies can be the solutions. They can be divided into two categories: solar-originated energies and non-solar-originated energies. Solar-originated energies include energies from wind, tide, water, biomass, solar cell, etc.

Non-solar-originated energies include terrestrial heat, nuclear power, etc. Terrestrial heat is not abundant on the earth, so that nuclear power has become one of the major power sources. However, after the nuclear catastrophes happened in Three-Miles Island, Fukushima, etc., people start to be worry about the safety issue of nuclear energy.

Alternative energies are necessary. Solar energy is the cleanest energy and is so abundant to a degree almost never running out. Solar cell has an electron-hole pairing rate, which can be effectively restrained by growing a $SiO_2$ thin film on a silicon wafer through oxidation at a high temperature (>900° C.). Yet, this method is not applicable in industrial manufacture. The main reason is that life times of a few carriers in a silicon material are very sensitive to high temperature, especially the silicon wafer. When the temperature is higher than 900° C., the life times of a few carriers will be greatly declined. To deal with the problem, surface passivation is a solution.

$SiN_x$ thin film is widely used in oxidation having a high temperature (>900° C.). Plasma-enhanced chemical vapor deposition (PECVD) is used to cover the $SiN_x$ thin film on a solar cell having a p-type substrate for obtaining a low surface electron-hole pairing rate. However, the $SiN_x$ thin film has a high density of fixed positive charge and so is not applicable on a back surface of the solar cell having a p-type substrate. Luckily enough, an $Al_2O_3$ dielectric material has been proven to have negative charge for good passivation on the back surface of the solar cell having a p-type or n-type substrate.

Methods for fabricating an $Al_2O_3$ thin film include atomic layer deposition (ALD), plasma-enhanced chemical vapor deposition (PECVD), reactive sputtering, etc. Yet, these methods require vacuum environment, not to mention the deposition velocity slower than 2 nanometers per minute (nm/min) for ALD, and are thus not fit to be used in the industrial manufacture of solar cells.

The above prior arts do not meet the requirements concerning cost and efficiency. Hence, the prior arts do not fulfill all users' requests on actual use.

SUMMARY OF THE INVENTION

The main purpose of the present invention is to fabricate an $Al_2O_3$ thin film layer through a simple, fast and single procedure in an environment having a normal atmospheric pressure and a low temperature for obtaining both effects of chemical passivation and field effect passivation.

The second purpose of the present invention is to reduce leakage of surface current for improving or enhancing a photoelectric conversion rate.

The third purpose of the present invention is to fabricate the $Al_2O_3$ thin film layer at a deposition velocity high than 10 nm/min for saving time and cost.

The fourth purpose of the present invention is to fabricate the $Al_2O_3$ thin film layer having a fixed negative charge density higher than $10^{12}$ charges per cubic centimeter.

To achieve the above purposes, the present invention is a method of fabricating an $Al_2O_3$ thin film layer, comprising steps of: (a) obtaining a silicon wafer in a reaction chamber for atmospheric pressure chemical vapor deposition (APCVD) with nitrogen gas flown in and turning on a power source to heat up to a temperature and stop heating to obtain a native oxide layer of $SiO_2$ after obtaining heat balance of the silicon wafer; (b) flowing a first gas and a second gas into the reaction chamber through an inlet manifold and another inlet manifold, respectively, to grow and form an $Al_2O_3$ thin film layer on a surface of the silicon wafer after keeping the temperature for a period of time; and (c) cooling down the $Al_2O_3$ thin film layer to a room temperature. Accordingly, a novel method of fabricating an $Al_2O_3$ thin film layer is obtained.

BRIEF DESCRIPTIONS OF THE DRAWINGS

Figure 2:
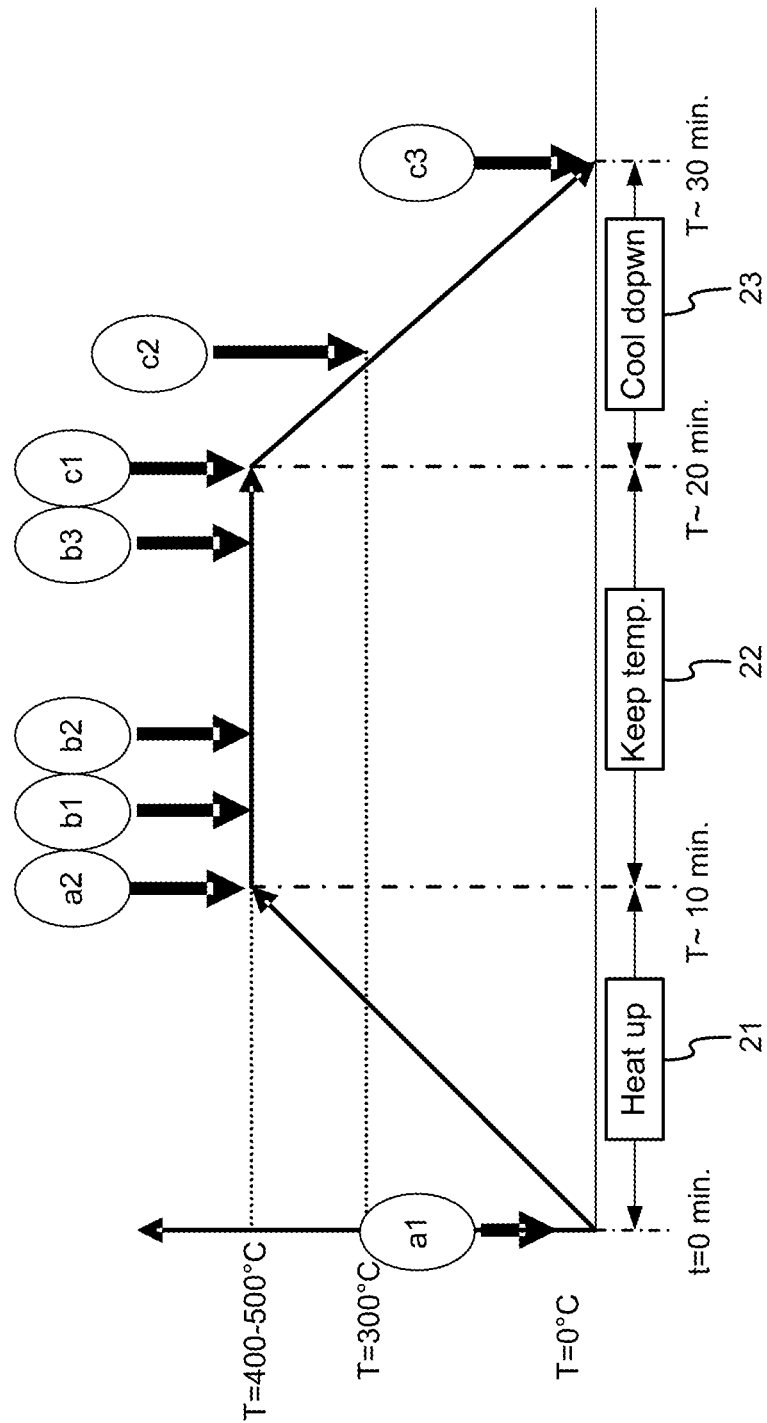

The present invention will be better understood from the following detailed description of the preferred embodiment according to the present invention, taken in conjunction with the accompanying drawings, in which FIG. 1 is the structural view showing the chamber for APCVD; and FIG. 2 is the view showing the temperature-time curve during fabricating the $Al_2O_3$ thin film layer.

DESCRIPTION OF THE PREFERRED EMBODIMENT

The following description of the preferred embodiment is provided to understand the features and the structures of the present invention.

Please refer to FIG. 1 and FIG. 2, which are a structural view showing a chamber for APCVD; and a view showing a temperature-time curve during fabricating an $Al_2O_3$ thin film layer. As shown in the figures, the present invention is a method of fabricating an $Al_2O_3$ thin film layer, comprising the following steps:

(a) Heating up 21: A silicon wafer 2 is obtained to be put into a reaction chamber 10 for atmospheric pressure chemical vapor deposition (APCVD) 1 with nitrogen gas flown in. Then, a power source, like a radiofrequency coil 11, is turned on to heat up to a temperature; and, then, heating is stopped at the temperature to obtain a native oxide layer of $SiO_2$ on a surface of the silicon wafer 2 after heat balance is achieved. Therein, the silicon wafer 2 is a p-type or n-type silicon wafer; the silicon wafer 2 has a purity between 5N (99.999%) and 9N (99.9999999%) and a thickness between 160 and 240 micrometers (μm); the temperature is between 400 and 500 Celsius degrees (° C.); the heating-up is processed for a time period of 8~12 minutes (min); and, the native oxide layer has a thickness of 1~2 nanometers (nm).

(b) Keeping temperature 22: A first gas and a second gas is flown into the reaction chamber 10 through an inlet manifold 12 and another inlet manifold 13, respectively, to grow and obtain an $Al_2O_3$ thin film layer on a surface of the silicon wafer 2 after keeping the temperature for a period of time, where the $Al_2O_3$ thin film layer has a thickness of 80~120 nm and gas left over is outputted from an outlet manifold 14; and the temperature is kept for a time period of 8~12 min.

(c) Cooling down 22: The $Al_2O_3$ thin film layer is cooled down to a room temperature.

Thus, a novel method of fabricating an $Al_2O_3$ thin film layer is obtained.

On using the present invention, a p-type or n-type silicon wafer 2 is used, which has a purity of 5N to 9N and a thickness about 200 μm. After processing cleansing on a surface, the silicon wafer 2 is put on a susceptor 15 in a reaction chamber 10 for APCVD 1. As shown in FIG. 2, the silicon wafer 2 is put into the reaction chamber 10 for step (a) of heating up. Step (a) comprises step (a1) and step (a2). In step (a1), nitrogen gas is flown in; and, then, a heat source is turned on for heating up. After heating up under a normal atmospheric pressure for 10 min, step (a2) is processed that the reaction chamber 10 is heated up to a temperature of 400~500° C. Then, heating-up is stopped to be kept at the temperature for 1~2 min. After the silicon wafer 2 is heat-balanced, a 1·2 nm $SiO_2$ native oxide layer is grown on the surface of the silicon wafer.2.

Then, keeping temperature of step (b) is processed. Temperature of the reaction chamber 10 is kept at 400~500° C. Step (b) comprises step (b1), step (b2) and step (b3). From an inlet manifold 12, TMA is transferred into the reaction chamber 10 by using nitrogen as a carrier gas in step (b1). In step (b2), after 1~2 min, oxygen is transferred into the reaction chamber 10 from another inlet manifold 13 by using nitrogen as a carrier gas. Thus, an $Al_2O_3$ thin film layer starts growing. After about 10 min, the $Al_2O_3$ thin film layer having a 100 nm thickness is formed on the surface of the silicon wafer. Then, TMA is stopped being transferred in step (b3).

After TMA is stopped being transferred for fabricating the $Al_2O_3$ thin film layer, cooling down of step (c) is processed, which comprises step (c1), step (c2) and step (c3). In step (c1), the power source is shut down to start the process of cooling down. In step (c2), after the temperature is cooled down from 400~500° C. to about 300° C., oxygen is stopped being transferred. At last, in step (c3), the temperature is cooled down to a room temperature. Thus, the whole processes for fabricating the $Al_2O_3$ thin film layer are finished in just 30 min.

The present invention has the following advantages:

(1) A non-vacuum APCVD device is used to directly deposit an $Al_2O_3$ thin film layer.

(2) The whole procedure is run under low temperature with little influence to life times of carriers in silicon material.

(3) The $Al_2O_3$ thin film layer is fabricated in a simple single procedure.

(4) Velocity of the deposition is high, which is higher than 10 nm/min, for saving time and cost.

(5) The $Al_2O_3$ thin film layer thus fabricated has a high fixed negative charge density, which is higher than $10^{12}$ charges per cubic centimeters.

(6) The $Al_2O_3$ thin film layer can be applied in solar cells with improved efficiency, simplified fabrication and reduced cost.

Hence, the present invention is processed in an environment having a normal atmospheric pressure and a low temperature. In a simple, fast and single procedure, an $Al_2O_3$ thin film layer is obtained, which obtains both effects of chemical passivation and field effect passivation on a p-type or n-type silicon wafer. Thus, the present invention can be applied in solar cells and other photoelectric devices to reduce leakage of surface current for improving or enhancing a photoelectric conversion rate.

To sum up, the present invention is a method of fabricating an $Al_2O_3$ thin film layer, where, in an environment having a normal atmospheric pressure and a low temperature, an $Al_2O_3$ thin film layer is fabricated through a simple, fast and single procedure; the $Al_2O_3$ thin film layer obtains both effects of chemical passivation and field effect passivation on a p-type or n-type silicon wafer; and ,thus, the present invention can be applied in solar cells and other photoelectric devices to reduce leakage of surface current for improving or enhancing a photoelectric conversion rate.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A method of fabricating an $Al_2O_3$ thin film layer, comprising steps of:
   (a) obtaining a silicon wafer in a reaction chamber with nitrogen gas flown in and turning on a power source to heat up to a temperature and stop heating to obtain a native oxide layer of $SiO_2$ after obtaining heat balance of said silicon wafer,
      wherein said reaction chamber is a chamber to process atmospheric pressure chemical vapor deposition (APCVD); and
      wherein said native oxide layer has a thickness of 1~2 nanometers (nm);
   (b) flowing a first gas and a second gas into said reaction chamber through an inlet manifold and another inlet manifold, respectively, to grow and obtain an $Al_2O_3$ thin film layer on a surface of said silicon wafer after keeping said temperature for a period of time,
      wherein said $Al_2O_3$ thin film layer has a thickness of 80~120 nm; and
   (c) cooling down said $Al_2O_3$ thin film layer to a room temperature.

2. The method according to claim 1,
   wherein, in step (a), said silicon wafer is selected from a group consisting of a p-type silicon wafer and an n-type silicon wafer.

3. The method according to claim 1,
   wherein, in step (a), said silicon wafer has a thickness of 160~240 micrometers (μm).

4. The method according to claim 1,
   wherein, in step (a), said silicon wafer is put into said reaction chamber after processing a surface cleansing.

5. The method according to claim 1,
   wherein, in step (a), said temperature is between 400 and 500 Celsius degrees (° C.).

6. The method according to claim 1,
   wherein, in step (a), said heating up is processed for a time period of 8~12 minutes (min).

7. The method according to claim 1,
   wherein, in step (b), said first gas is composed of nitrogen and trimethylaluminum (TMA).

8. The method according to claim 1,
   wherein, in step (b), said second gas is composed of nitrogen and oxygen.

9. The method according to claim 1,
   wherein, in step (b), said temperature is kept for a time period of 8~12 min.

10. The method according to claim 1, wherein, in step (b), said $Al_2O_3$ thin film layer is deposited at a velocity greater than 10 nm/min.

11. The method according to claim 1, wherein said $Al_2O_3$ thin film layer has a fixed negative charge density of $10^{12}$ charges per cubic centimeter.

* * * * *